(12) United States Patent
Sundstrom

(10) Patent No.: US 7,787,249 B2
(45) Date of Patent: Aug. 31, 2010

(54) SYSTEMS AND METHODS FOR PRINTED BOARD ASSEMBLY ISOLATED HEAT EXCHANGE

(75) Inventor: Lance L. Sundstrom, Pinellas Park, FL (US)

(73) Assignee: Honeywell International Inc., Morristown, NJ (US)

( * ) Notice: Subject to any disclaimer, the term of this patent is extended or adjusted under 35 U.S.C. 154(b) by 23 days.

(21) Appl. No.: 12/364,862

(22) Filed: Feb. 3, 2009

(65) Prior Publication Data

US 2010/0195287 A1    Aug. 5, 2010

(51) Int. Cl.
*H05K 7/20* (2006.01)
*H05K 1/00* (2006.01)

(52) U.S. Cl. ............. 361/714; 361/679.46; 361/679.54; 361/704; 361/720; 361/752; 29/831; 29/832; 29/840; 29/830; 174/16.3; 174/252; 257/698; 257/706; 257/713; 257/686; 165/80.3; 165/104.33; 165/185

(58) Field of Classification Search ............ 361/679.46, 361/679.54, 702–712, 714, 719, 720, 724–727, 361/748–752, 756, 759, 792–795; 165/80.2, 165/80.3, 80.4, 104.33, 104.34, 185; 174/16.3, 174/250, 252, 255, 16.1, 52.1, 17 VA, 52.2; 29/830, 831, 832, 840, 846, 852; 257/686, 257/698, 706–727, 778 M, 779, 787, 676
See application file for complete search history.

(56) References Cited

U.S. PATENT DOCUMENTS

| | | | | |
|---|---|---|---|---|
| 4,475,145 A | * | 10/1984 | Heil et al. ................... | 361/720 |
| 4,867,235 A | * | 9/1989 | Grapes et al. ............... | 165/185 |
| 5,220,485 A | * | 6/1993 | Chakrabarti ................ | 361/720 |
| 5,258,887 A | * | 11/1993 | Fortune ...................... | 361/720 |
| 5,508,885 A | * | 4/1996 | Ishimoto ..................... | 361/720 |
| 5,617,294 A | | 4/1997 | Watson et al. | |
| 5,949,650 A | * | 9/1999 | Bulante et al. .............. | 361/704 |
| 5,982,630 A | | 11/1999 | Bhatia | |

(Continued)

FOREIGN PATENT DOCUMENTS

JP    405315782 A   *   11/1993

OTHER PUBLICATIONS

Bornoff, Robin, "Improved Thermal Design of PCBs Using Surface Optimization Modeling", "Printed Circuit Design & Fabrication", Aug. 1, 2007, Publisher: http://pcdandf.com/cms/.

(Continued)

*Primary Examiner*—Michael V Datskovskiy
(74) *Attorney, Agent, or Firm*—Shumaker & Sieffert, P.A.

(57) ABSTRACT

Systems and methods for printed board assembly isolated heat exchange are provided. In one embodiment, a printed board assembly comprises: at least one electrical power layer; at least one electrical ground layer; a first signal layer having a first signal routing area providing electrical trace connections for signals and a first heat exchange chassis fill conductor area located adjacent to a periphery of the first signal routing area; at least one thermal interface coupled to a chassis for conducting heat from the printed board assembly to the chassis; and at least one via conductively coupling the first heat exchange chassis fill conductor area to the at least one thermal interface.

20 Claims, 7 Drawing Sheets

U.S. PATENT DOCUMENTS

| | | | |
|---|---|---|---|
| 6,031,727 | A | 2/2000 | Duesman et al. |
| 6,212,071 | B1 * | 4/2001 | Roessler et al. .............. 361/704 |
| 6,212,076 | B1 * | 4/2001 | MacQuarrie et al. ......... 361/720 |
| 6,246,582 | B1 * | 6/2001 | Habing et al. ................ 361/704 |
| 6,605,778 | B2 * | 8/2003 | Dorfler et al. ................ 174/524 |
| 6,873,528 | B2 * | 3/2005 | Hulan et al. .................. 361/719 |
| 7,087,845 | B2 * | 8/2006 | Tohkairin et al. ............ 174/252 |
| 7,349,221 | B2 * | 3/2008 | Yurko .......................... 361/719 |
| 7,477,524 | B2 * | 1/2009 | Way ............................ 361/801 |
| 7,479,013 | B2 * | 1/2009 | Takezaki et al. .............. 439/55 |
| 7,483,271 | B2 * | 1/2009 | Miller et al. ................. 361/704 |
| 7,629,683 | B1 * | 12/2009 | Lima ........................... 257/713 |
| 7,660,125 | B2 * | 2/2010 | Ireland et al. ................ 361/720 |
| 2005/0113705 | A1 * | 5/2005 | Fischell et al. .............. 600/515 |

OTHER PUBLICATIONS

"Series 260-'card-lok' retainer (cold plate)", http://www.calmark.com/pdfs/260.pdf, Jan. 10, 2007, pp. 36-37, Publisher: Calmark Corporation.

Semena, N.P. et al., "Using PCB Layout for Maintenance of a Thermal Mode in Very Large-Scale Integrated Circuits of Space-Application Electron", "Thermophysics and Aeromechanics", 2006, pp. 103-110, vol. 13, No. 1.

* cited by examiner

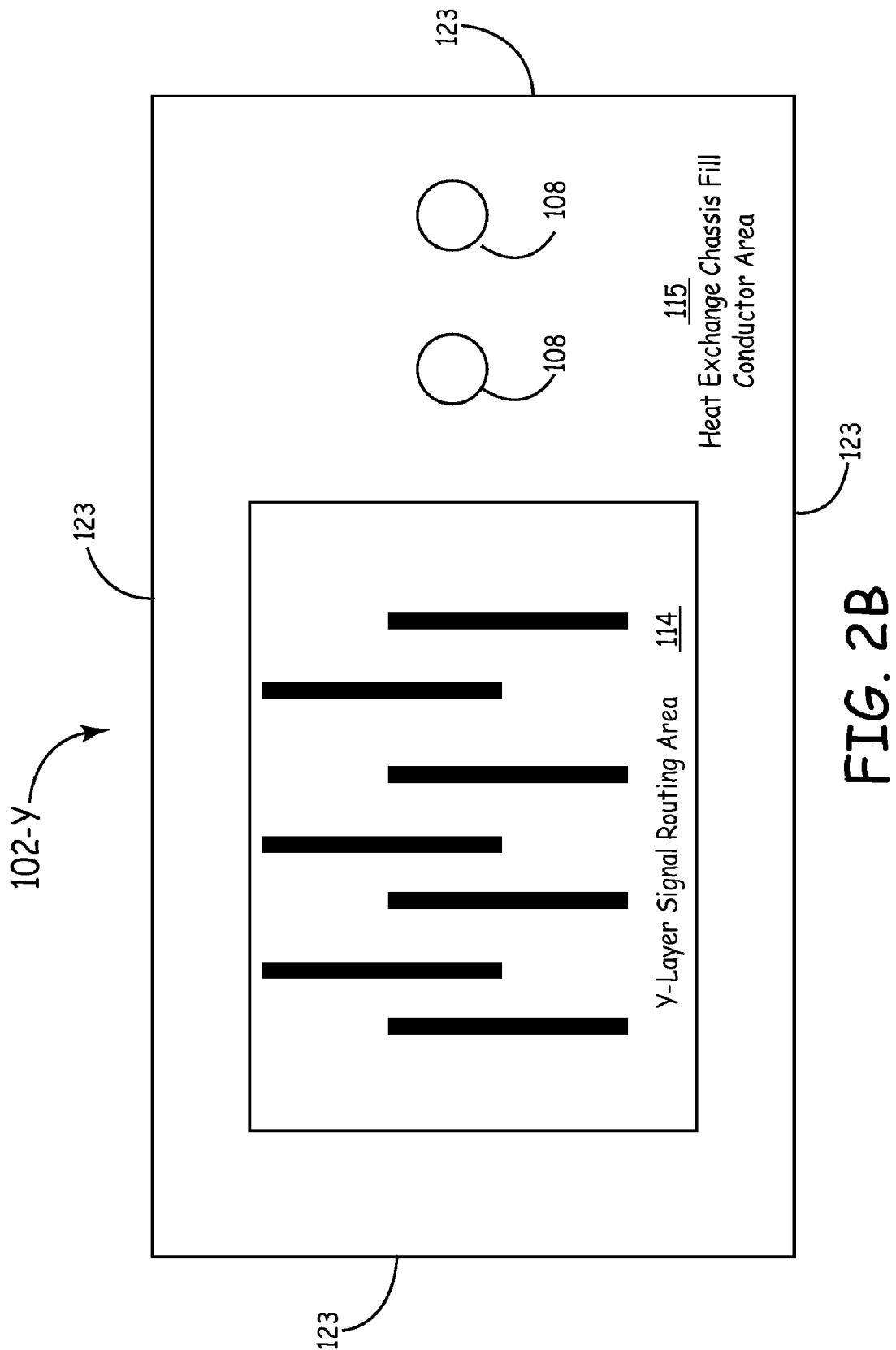

US 7,787,249 B2

SYSTEMS AND METHODS FOR PRINTED BOARD ASSEMBLY ISOLATED HEAT EXCHANGE

GOVERNMENT LICENSE RIGHTS

The U.S. Government may have certain rights in the present invention as provided for by the terms of a subcontract to a Government Contract to Lockheed Martin number 4089.

BACKGROUND

Printed board assembly (PBA) designs, such as a standard electronic module-format E (SEM-E) format, often rely solely on thermal conduction through a peripheral wedge-clamp, or bolt interface, for thermal management. The wedge-clamp or bolt interface is designed to provide good thermal conduction between the PBA and its host chassis, (typically aluminum). However, electromagnetic compatibility (EMC) and electromagnetic interference (EMI) requirements often require electrical isolation between circuits and chassis. In addition, the PB conductor and dielectric stack-up doesn't often have room for dedicated electrically isolated thermal chassis conductor layers. So the problem is to find a way to provide good thermal conduction between components and the wedge-clamp or bolt thermal interface without adding PB conductor layers and while maintaining electrical isolation between circuits and chassis.

For the reasons stated above and for other reasons stated below which will become apparent to those skilled in the art upon reading and understanding the specification there is a need in the art for systems and methods for improved electrically isolated heat exchange for PBAs.

SUMMARY

The Embodiments of the present invention provide methods and systems for improved electrically isolated heat exchange for printed board assemblies (PBAs) and will be understood by reading and studying the following specification.

In one embodiment, a printed board assembly comprises: at least one electrical power layer; at least one electrical ground layer; a first signal layer having a first signal routing area providing electrical trace connections for signals and a first heat exchange chassis fill conductor area located adjacent to a periphery of the first signal routing area; at least one thermal interface coupled to a chassis for conducting heat from the printed board assembly to the chassis; and at least one via conductively coupling the first heat exchange chassis fill conductor area to the at least one thermal interface.

DRAWINGS

Embodiments of the present invention can be more easily understood and further advantages and uses thereof more readily apparent, when considered in view of the description of the preferred embodiments and the following figures in which:

FIGS. 2A-2D are diagrams illustrating printed board (PB) conductor layers of a printed board assembly (PBA) of one embodiment of the present invention.

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical, electrical and method changes may be made without departing from the scope of the present invention. The following detailed description is, therefore, not to be taken in a limiting sense.

Figure 1:
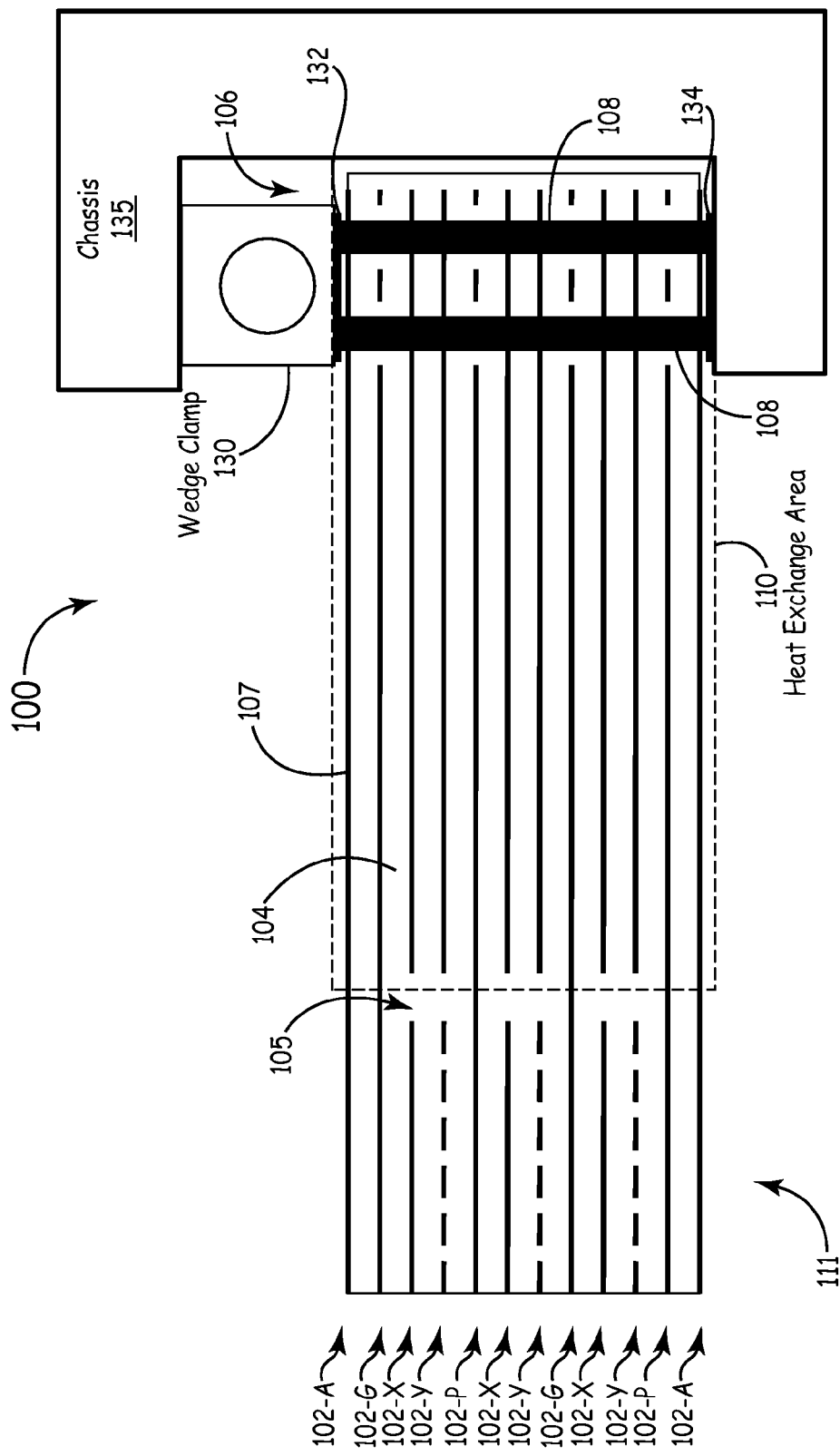
FIG. 1 is a side cross-section view diagram illustrating the printed board (PB) conductor layers of a printed board assembly (PBA) of one embodiment of the present invention.

FIG. 1 is a side cross-section view diagram illustrating a printed board assembly (PBA) 100 having a stack-up of printed board (PB) conductor and dielectric layers (shown generally at 111), and having a heat exchange structure of one embodiment of the present invention. PBA 100 comprises at least one circuit power conductor layer 102-P, at least one circuit ground conductor layer 102-G, at least one X-direction signal conductor layer (102-X), at least one Y-direction signal conductor layer (102-Y), at least one surface attach pad conductor layer (102-A) and a plurality of via connections 108. The via connections 108 are thermally coupled to a wedge-clamp 130 thermal interface though a thermal footprint 132 at the top PB 111 surface. The via connections 108 are also thermally coupled to a second thermal footprint 134 located on the bottom PB 111 surface. The thermal interface is comprised of PB 111 surface chassis fill conductor patterns on both sides at the wedge-clamp edges of the PB 111. A surface chassis fill conductor pattern serves as the thermal footprint 132 for direct contact to the wedge-clamp 130. Another surface chassis fill conductor pattern on the opposite side serves as the thermal footprint 134 for direct contact to a chassis 135 channel wall.

As explained in greater detail below, each of the buried signal conductor layers 102-X and 102-Y includes a heat exchange element in the form of a chassis fill conductor area (shown at 104, for example) starting at the periphery of a signal routing area (shown at 105, for example) to the approximate edges of the PB (shown at 106, for example). The buried chassis fill conductor area 104 is thermally coupled to the wedge-clamp thermal interface 130 at both thermal footprints 132 and 134 through the multiple vias 108. Similarly, surface attach pad conductor layer 102-A includes a heat exchange element in the form of a surface chassis fill conductor area (shown at 107, for example) and discussed in greater detail below. Chassis fill conductor areas for each of the plurality of conductor layers thus define a heat exchange area 110 of PB 111 of PBA 100.

As shown in FIG. 1, multiple thermal vias 108 connect all surface and buried chassis fill thermal conductor layers together within the thermal interface area. The wedge-clamp 130 edge of the PBA 100 is inserted into a card guide channel of the chassis 135. When the wedge-clamp 130 is tightened, it expands to lock the PBA 100 and wedge-clamp against opposite chassis 135 channel walls. The expansion pressure of the wedge-clamp 130 forms a direct thermal contact between one side of the PBA 100 thermal interface (at footprint 134) and one chassis 130 channel wall and an indirect thermal contact from the other side of the PBA 100 thermal interface (at footprint 132), through the wedge-clamp 130, to the other chassis 135 channel wall. One example of a wedge-clamp which may be used to implement wedge-clamp 130 is the Calmark Corporation series 260 "Card-lok" retainer. However, wedge clamps for realizing embodiments of the present invention are not limited to the Calmark Corporation series 260 "Card-lok" retainer.

As would be appreciated by one of ordinary skill in the art upon reading this specification, with embodiments of the present invention, heat generated by electrical components is conducted through multiple via connections to circuit power and circuit ground conductor layers (102-P and 102-G) of PB 111. Each circuit power and circuit ground conductor layer (102-P and 102-G) conducts and spreads component heat across its area. As shown in FIG. 1, each circuit power conductor layer (102-P) and each circuit ground conductor layer (102-G) overlaps with, and is directly adjacent to, one or more chassis fill conductor layers in heat exchange area 110 of PB 111. The combination of large effective overlap area and minimum separation distance (for example, a single dielectric layer) facilitates heat exchange between the circuit power and ground conductor layers (102-P and 102-G) chassis fill conductor areas in the heat exchange area 110 of PB 111. The chassis fill conductor areas are discussed in greater detail in FIGS. 2A-2C below. This heat is then conducted through multiple thermal vias 108 to chassis 130 through footprints 132 and 134. Embodiments of the present invention further maintain electrical isolation between PBA circuits and the chassis.

Figure 2A:
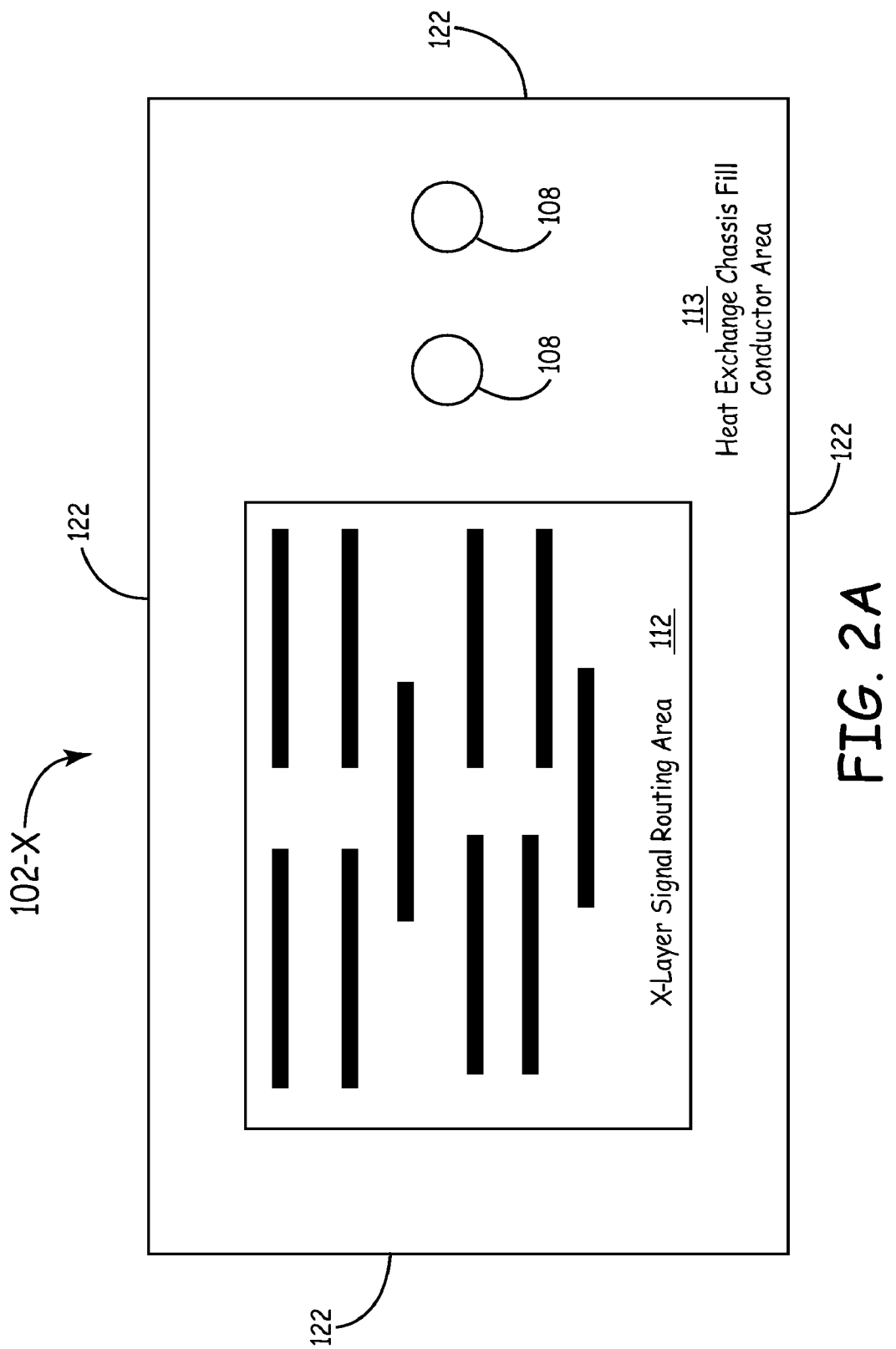

FIG. 2A illustrates an X-direction signal conductor layer (102-X) of a PB 111 of PBA 100 of one embodiment of the present invention. X-layer signal traces are routed in an X-layer signal routing area 112 that is away from (that is, separated from) wedge-clamp 130 thermal interface edges connected to vias 108. A heat exchange chassis fill conductor area 113 is provided beginning at the X-layer signal routing area 112 periphery to the edges of the PB 111 (shown generally at 122).

FIG. 2B illustrates a Y-direction signal conductor layer (102-Y) of a PB 111 of PBA 100 of one embodiment of the present invention. Y-layer signal traces are routed in a Y-layer signal routing area 114 that is away from wedge-clamp 130 thermal interface edges connected to vias 108. A heat exchange chassis fill conductor area 115 is provided beginning at the Y-layer signal routing area 114 periphery to the edges of the PB 111 (shown generally at 123).

Figure 2C:
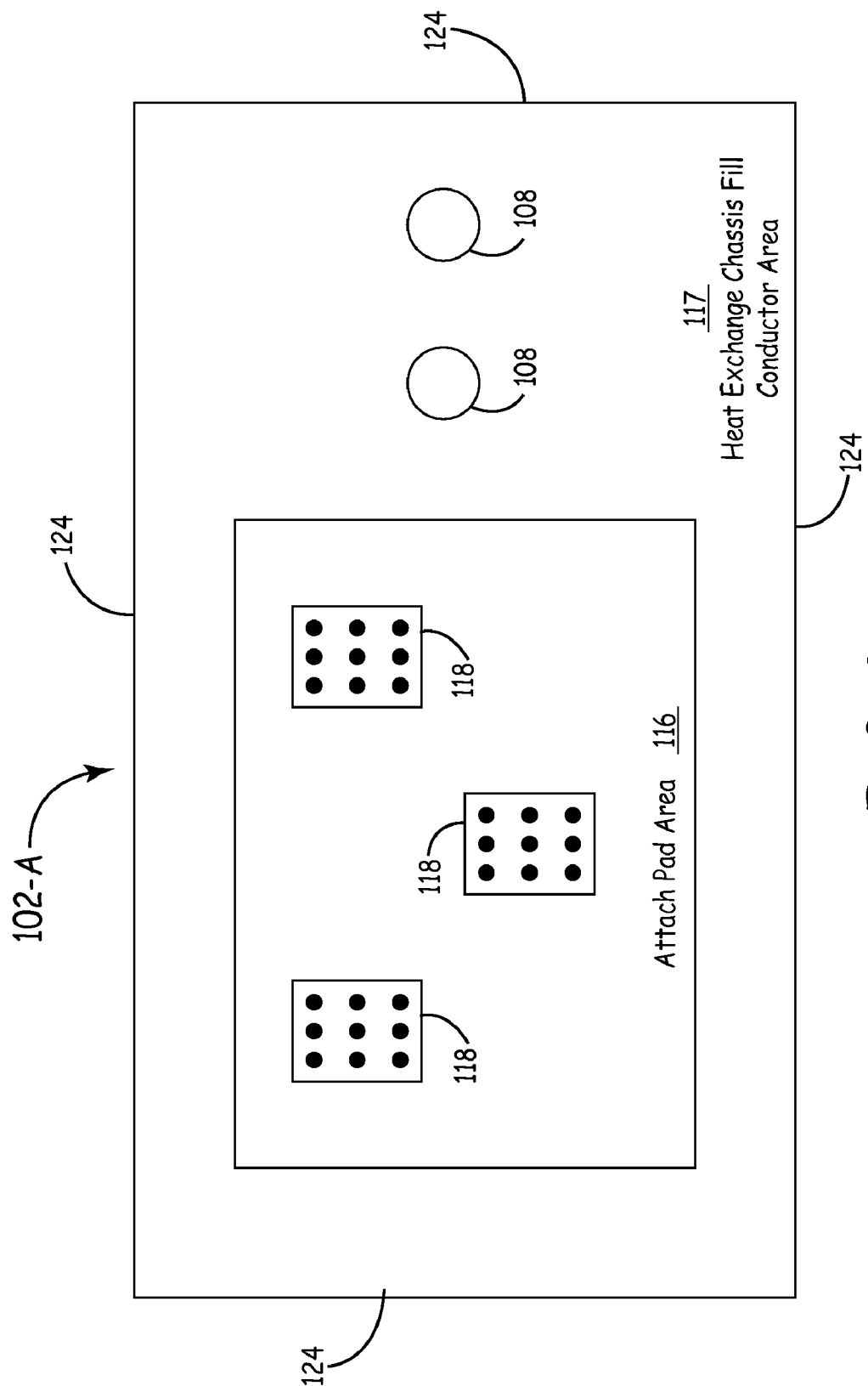

FIG. 2C illustrates a surface pad connection conductor layer (102-A) of a PB 111 of PBA 100 of one embodiment of the present invention. Surface pad connection conductor layer (102-A) comprises an attach pad area 116 that includes one or more surface attach pad interfaces 118 for electrically coupling electrical devices to PB 111 of PBA 100. An attach pad interface 118 may, in alternate embodiments, accommodate the interfacial power and ground attach pads of a surface mount technology (SMT) ceramic quad flat pack (CQFP) package, or the drain, source and gate of a power SMT metal oxide semiconductor field effect transistor (MOSFET) package. Attach pad area 116 is located away from wedge-clamp 130 thermal interface edges connected to vias 108 and vertically aligned with at least one of X-layer signal routing area 112 and Y-layer signal routing area 114. A heat exchange surface chassis fill conductor area 117 is provided beginning at the attach pad area 116 periphery to the edges of the PB 111 (shown generally at 124).

Figure 2D:
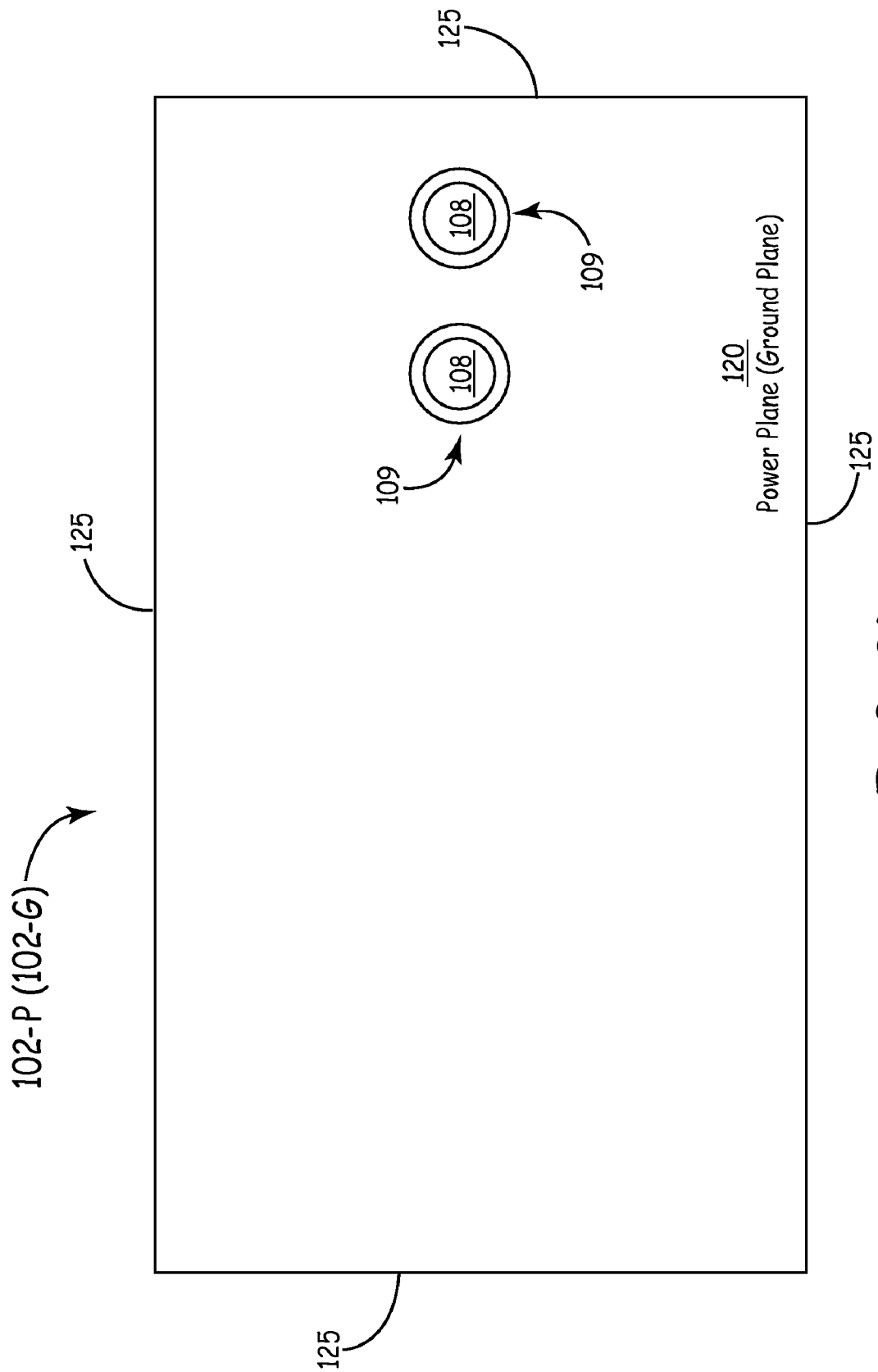

FIG. 2D is a diagram illustrating a power conductor layer 102-P (or alternatively, a ground conductor layer 102-G) of PB 111 of PBA 100 of one embodiment of the present invention. Power conductor plane (ground conductor plane) is extended to essentially cover the entire layer out to the edges of the PB (shown generally at 125). Electrical separation from the wedge-clamp 130 thermal interface is maintained by isolation gaps 109 around vias 108.

The multiple heat exchange chassis fill conductor areas 113, 115 and 117 are each tied with the multiple via connections 108 to the wedge clamp 130 thermal interface. In one embodiment, the heat exchange area chassis fill conductor areas 113, 115 and 117 are each comprised of the same electrically conducting material used for electrical traces or planes on that layer (for example, copper). One of ordinary skill in the art, upon reading this specification, would appreciate that a target thermal efficiency for any given application may be achieved by selecting the ratio of effective chassis fill heat exchange area to the component power dissipation and thermal gradient between the components and chassis. That is, an effectively larger heat exchange area will provide lower thermal resistance and greater heat exchange capacity. Also note that one of ordinary skill in the art would appreciate that the phrase used herein "to at least one edge" would be understood by one of skill in the art upon reading this specification as an approximation rather than requiring absolute precision of matching an edge of the heat exchange area chassis fill with the edge of the printed board. Reduction of the heat exchange area from the exact edge will accordingly reduce heat exchange capacity in a determinable manner.

Although areas 112, 114 and 116 are illustrated as rectangular, embodiments having poly-sided, curved or irregularly shaped areas for signal routing and component attachment pads, are contemplated as being within the scope of the present invention.

Figure 3:
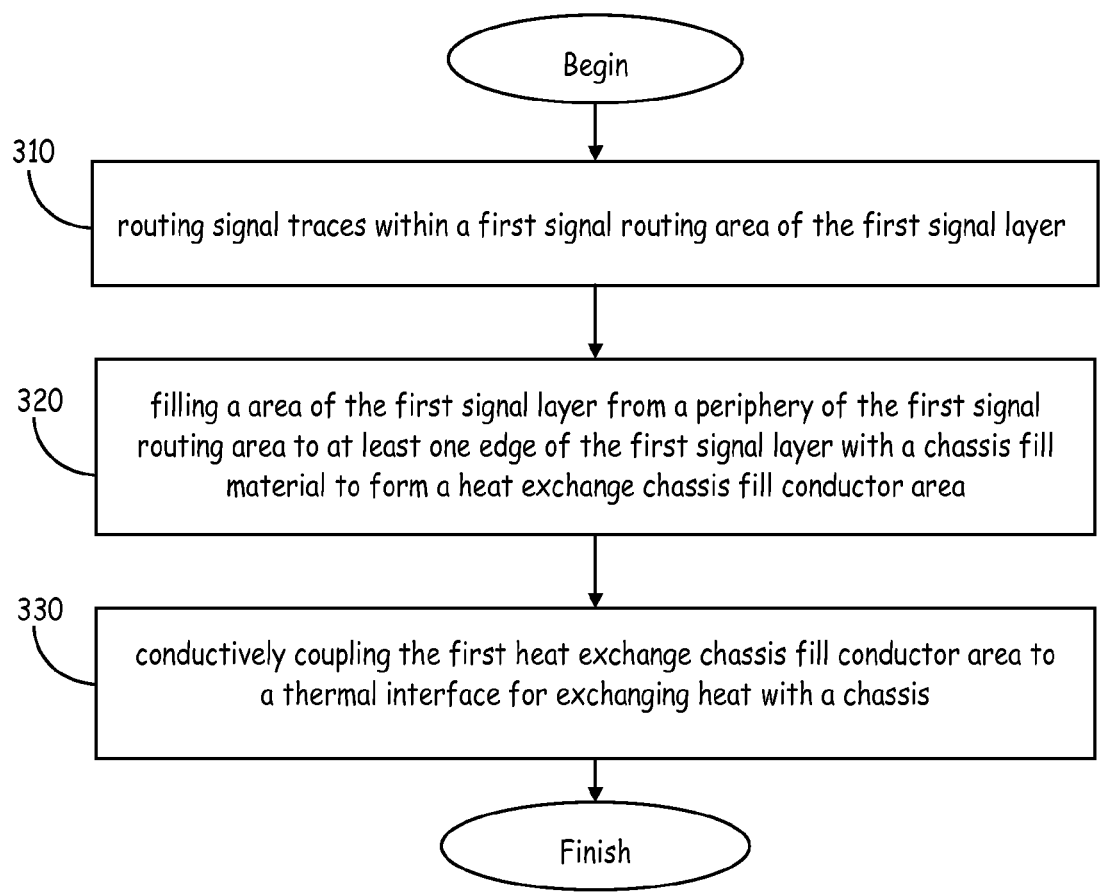
FIG. 3 is a flow chart illustrating a method of one embodiment of the present invention.

FIG. 3 is a flow chart illustrating a method of one embodiment of the present invention for a printed board assembly (PBA) including at least one electrical power conductor layer, at least one electrical ground conductor layer and a first signal conductor layer. The method begins at 310 with routing signal traces within a first signal routing area of the first signal conductor layer. As described above, the first signal routing area may, in alternate embodiments, comprise either X or Y oriented signal traces. The method proceeds to 320 with filling an area of the first signal conductor layer from a periphery of the first signal routing area to at least one PB edge of the first signal conductor layer with a chassis fill material to form a heat exchange chassis fill area.

When placed in operation, heat generated by electrical components is conductively collected through the power and ground planes and through the heat exchange areas to the chassis fill areas located on the buried signal and surface attach pad layers of the PB. The thermal energy collected from the chassis fill areas is removed from the PBA by the wedge-clamp thermal interface without the need to add any additional printed board (PB) conductor layers to the PBA. Further, each circuit power layer and circuit ground conductor layer overlaps with, and is directly adjacent to, at least one chassis fill conductor area which facilitates heat exchange between the two and enables the heat exchange chassis fill conductor areas to collect heat from the circuit power and ground layers. Embodiments of the present invention further maintain electrical isolation between PBA circuits and the chassis. The method thus proceeds to 330 with conductively coupling the first heat exchange chassis fill conductor area to a thermal interface and mounting device for exchanging heat with a chassis. The thermal interface and mounting device may comprise at least one of, but not limited to, a wedge clamp and/or a bolt. For embodiments of PBAs with multiple signal layers (which is typically the case), each signal layer is produced with a heat exchange chassis fill area as described in block 320. The multiple heat exchange chassis fill areas are each then tied (as described in block 330) with the multiple via connections 108 to the thermal interface. As discussed above, the signal layers are placed within the PBA stack adjacent to at least one of an electrical power layer and an electrical ground layer. The proximity of the heat exchange chassis fill areas to these layers enables them to conduct heat from the adjacent circuit power or circuit ground layers to the thermal interface. Further, a heat exchange surface chassis fill area may be provided for surface attach pad layers by filling an area from a periphery of the attach pad area to at least one edge of the PB with a chassis fill material to form the heat exchange surface chassis fill area. The heat exchange surface chassis fill area can is then also conductively coupled to the thermal interface for providing further heat exchange with the chassis.

Figure 4:
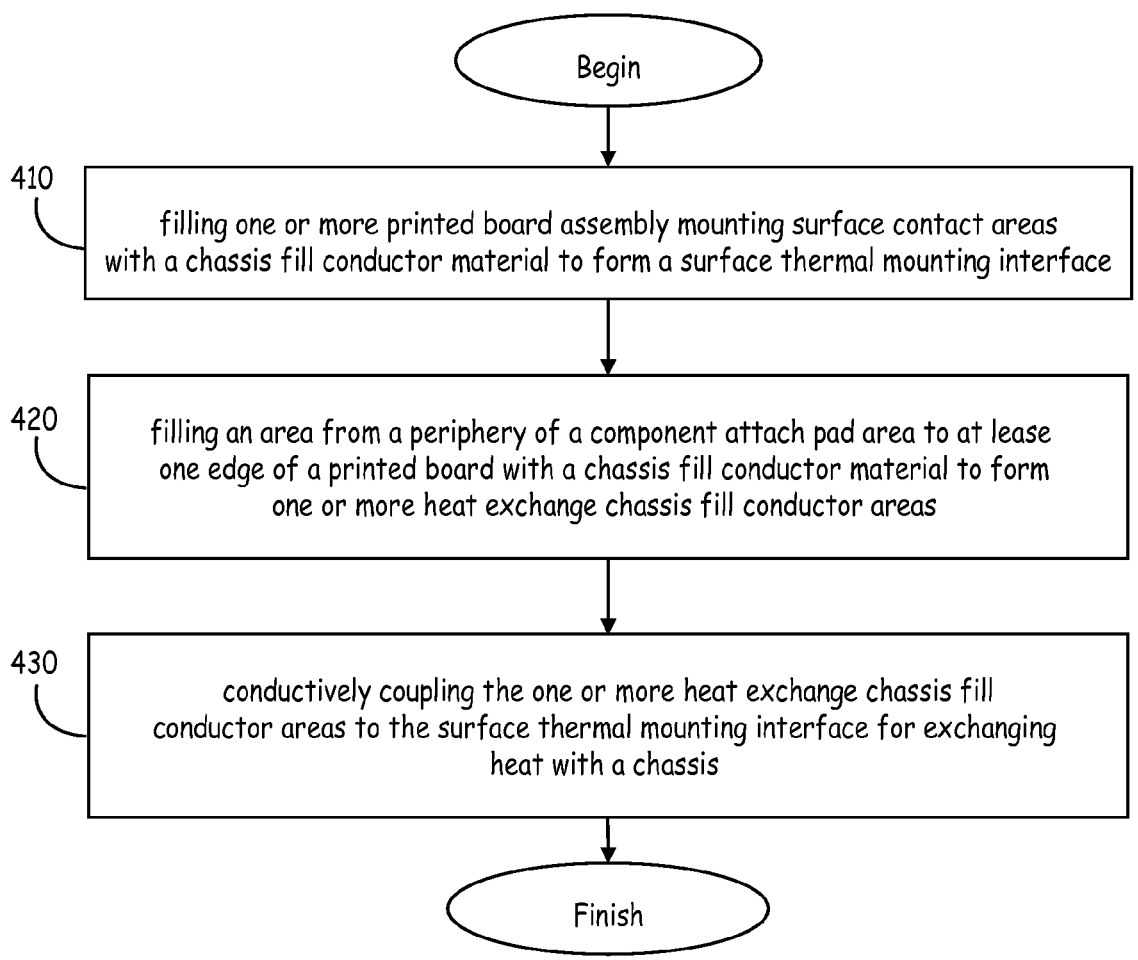
FIG. 4 is a flow chart illustrating a method of one embodiment of the present invention.

FIG. 4 is a flow chart illustrating a method of one embodiment of the present invention for a surface pad connection conductor layer, such as shown in FIG. 2C. The method begins at 410 with filling one or more PBA mounting surface contact areas with a chassis fill conductor material to form a surface thermal mounting interface. The method then proceeds to 420 with filling an area from a periphery of a component attach pad area to at lease one edge of a PB with a chassis fill conductor material to form one or more heat exchange chassis fill conductor areas. As discussed above, heat generated by electrical components is conductively collected through the power and ground planes and through the heat exchange areas to the chassis fill areas located on the buried signal and surface attach pad layers of the PB. The method then proceeds to 430 with conductively coupling the one or more heat exchange chassis fill conductor areas to the surface thermal mounting interface for exchanging heat with a chassis.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A printed board assembly, the printed board assembly comprising:
   at least one electrical power layer;
   at least one electrical ground layer;
   a first signal layer having a first signal routing area providing electrical trace connections for signals and a first heat exchange chassis fill conductor area located adjacent to a periphery of the first signal routing area;
   at least one thermal interface coupled to a chassis for conducting heat from the printed board assembly to the chassis; and
   at least one via conductively coupling the first heat exchange chassis fill conductor area to the at least one thermal interface.

2. The printed board assembly of claim 1, wherein the first signal layer is an adjacent layer to the at least one power layer and the first heat exchange chassis fill conductor area conducts heat from the at least one power layer.

3. The printed board assembly of claim 1, wherein the first signal layer is an adjacent layer to the at least one electrical ground layer and the first heat exchange chassis fill conductor area conducts heat from the at least one electrical ground layer.

4. The printed board assembly of claim 1 further comprising:
   a second signal layer having a second signal routing area providing electrical trace connections for signals and a second heat exchange chassis fill conductor area located adjacent to a periphery of the second signal routing area;
   wherein the at least one via conductively couples the first heat exchange chassis fill conductor area and the second heat exchange chassis fill conductor area to the at least one thermal interface.

5. The printed board assembly of claim 1, further comprising a thermal interface mounting device that includes at least one of a wedge clamp or a bolt.

6. The printed board assembly of claim 1 further comprising:
   at least one surface attach pad layer, the at least one surface attach pad layer including an attach pad area and a heat exchange surface chassis fill conductor area located adjacent to a periphery of the attach pad area;
   wherein the at least one via conductively couples the first heat exchange chassis fill conductor area and the heat exchange surface chassis fill conductor area to the at least one thermal interface.

7. The printed board assembly of claim 6, wherein the attach pad area includes at least one attach pad interface for electrically coupling an electrical device to the at least one attach pad layer.

8. The printed board assembly of claim 1, wherein the first heat exchange chassis fill conductor area is electrically isolated from the first signal routing area.

9. The printed board assembly of claim 1, wherein the first heat exchange chassis fill conductor area extends from the periphery of the first signal routing area to at least one edge of a printed board.

10. The printed board assembly of claim 1, wherein the first heat exchange chassis fill conductor area separates the first signal routing area from the via.

11. A printed board layer for a signal layer of a printed board assembly, the printed board layer comprising:
    a signal routing area providing electrical trace connections for signals; and
    a heat exchange chassis fill conductor area adjacent to a periphery of the signal routing area and connected by a via to a thermal interface, the heat exchange chassis fill conductor area separating the signal routing area from the via.

12. The assembly of claim 11, further comprising a thermal interface mounting device that includes at least one of a wedge clamp or a bolt.

13. The assembly of claim 11, wherein the heat exchange chassis fill conductor area is electrically isolated from the signal routing area providing electrical trace connections.

14. The assembly of claim 11, wherein the heat exchange chassis fill conductor area is adjacent to one of a assembly providing electrical power or a printed board layer providing electrical ground.

15. The assembly of claim 11, wherein the heat exchange chassis fill conductor area extends from the periphery of the signal routing area to at least one edge of the printed board.

16. A method for managing heat for a printed board assembly including at least one electrical power layer, at least one electrical ground layer and a first signal layer of a printed board, the method comprising:

routing signal traces within a first signal routing area of the first signal layer;

filling an area of the first signal layer from a periphery of the first signal routing area to at least one edge of the printed board with a chassis fill material to form a heat exchange chassis fill conductor area; and conductively coupling the heat exchange chassis fill conductor area to a thermal interface for exchanging heat with a chassis.

17. The method of claim 16, wherein the heat exchange chassis fill conductor area is coupled to the thermal interface through one or more vias.

18. The method of claim 16, wherein the heat exchange chassis fill conductor area is positioned adjacent to the at least one electrical power layer and conducts heat from the at least one electrical power layer to the thermal interface.

19. The method of claim 16, wherein the heat exchange chassis fill conductor area is positioned adjacent to the at least one electrical ground layer and conducts heat from the at least one electrical power layer to the thermal interface.

20. The method of claim 16, the printed board assembly further including a printed board with at least one surface attach pad layer having an attach pad area;

filling an area of the first signal layer from a periphery of the attach pad area to at least one edge of the printed board with a chassis fill material to form a heat exchange surface chassis fill conductor area; and conductively coupling the heat exchange surface chassis fill conductor area to the thermal interface for exchanging heat with the chassis.

* * * * *

UNITED STATES PATENT AND TRADEMARK OFFICE
CERTIFICATE OF CORRECTION

Page 1 of 1

| | |
|---|---|
| PATENT NO. | : 7,787,249 B2 |
| APPLICATION NO. | : 12/364862 |
| DATED | : August 31, 2010 |
| INVENTOR(S) | : Lance L. Sundstrom |

It is certified that error appears in the above-identified patent and that said Letters Patent is hereby corrected as shown below:

Col. 6, Line 42 (Claim 11), "A printed board layer for a signal layer of a printed board assembly, the printed board layer comprising:" should be --An assembly comprising: a printed board comprising a printed board layer, the printed board layer comprising:--

Signed and Sealed this
Twenty-fourth Day of May, 2011

David J. Kappos
*Director of the United States Patent and Trademark Office*

UNITED STATES PATENT AND TRADEMARK OFFICE
CERTIFICATE OF CORRECTION

PATENT NO. : 7,787,249 B2  
APPLICATION NO. : 12/364862  
DATED : August 31, 2010  
INVENTOR(S) : Lance L. Sundstrom Page 1 of 1

It is certified that error appears in the above-identified patent and that said Letters Patent is hereby corrected as shown below:

Col. 6, Line 58 (Claim 14), "one of a assembly" should be --one of a printed board layer--

Signed and Sealed this
Sixteenth Day of August, 2011

David J. Kappos
*Director of the United States Patent and Trademark Office*